(12) United States Patent
Butler

(10) Patent No.: US 6,405,484 B1
(45) Date of Patent: Jun. 18, 2002

(54) SEALING SYSTEM IN WHICH THERE IS RELATIVE SLIDING MOTION BETWEEN A GATE AND A PORT

(75) Inventor: Steven Butler, Queanbeyan (AU)

(73) Assignee: Lintek Pty. Ltd., Queanbeyan (AU)

( * ) Notice: Subject to any disclaimer, the term of this patent is extended or adjusted under 35 U.S.C. 154(b) by 0 days.

(21) Appl. No.: 09/424,658

(22) PCT Filed: May 26, 1998

(86) PCT No.: PCT/AU98/00389

§ 371 (c)(1),
(2), (4) Date: Nov. 29, 1999

(87) PCT Pub. No.: WO98/54492

PCT Pub. Date: Dec. 3, 1998

(30) Foreign Application Priority Data

May 30, 1997 (AU) .......................................... PO 7119

(51) Int. Cl.⁷ .............................................. E05D 15/28
(52) U.S. Cl. ............................... 49/246; 49/153; 49/257
(58) Field of Search .......................... 49/153, 246, 257, 49/258, 209, 208

(56) References Cited

U.S. PATENT DOCUMENTS

| | | | | | |
|---|---|---|---|---|---|
| 2,072,641 A | * | 3/1937 | Madland | ...................... | 49/142 |
| 2,483,968 A | * | 10/1949 | Ecklund | ...................... | 110/176 |
| 3,440,762 A | * | 4/1969 | Olsson | ...................... | 49/209 |
| 3,683,552 A | * | 8/1972 | Bollinger | ...................... | 49/209 |
| 3,758,919 A | * | 9/1973 | Dilworth | ...................... | 16/240 |
| 3,918,204 A | * | 11/1975 | Lynch et al. | ...................... | 49/246 |
| 4,118,016 A | * | 10/1978 | Western et al. | ...................... | 266/130 |
| 4,334,633 A | * | 6/1982 | Piegza | ...................... | 49/199 |
| 4,372,603 A | * | 2/1983 | Stanczak et al. | ...................... | 296/146.12 |
| 4,433,951 A | | 2/1984 | Koch et al. | | |
| 4,655,499 A | * | 4/1987 | Piper | ...................... | 296/146.11 |
| 4,699,555 A | | 10/1987 | Guarino | | |
| 5,544,449 A | * | 8/1996 | Amelio et al. | ................. | 49/383 |
| 5,575,487 A | | 11/1996 | Balsells | | |

FOREIGN PATENT DOCUMENTS

| | | | | | |
|---|---|---|---|---|---|
| FR | | 484817 | * 11/1917 | .................. | 49/257 |
| FR | | 842455 | * 6/1939 | .................. | 49/246 |
| FR | | 1509516 | * 1/1968 | .................. | 49/246 |

OTHER PUBLICATIONS

Derwent Abstract Accession No. 77—g72827y class Q66, BE 835458 (SA AMC ET AB Wurth) Aug. 1977.

* cited by examiner

*Primary Examiner*—Gregory J. Strimbu
(74) *Attorney, Agent, or Firm*—Michael D. Bednarek; Shaw Pittman LLP

(57) ABSTRACT

A sealing system includes a gate (2) which is pivotably mounted to a crank (3) which is mounted for rotation with shaft (1). A spring (5) is disposed between gate (2) and crank (3). The gate (2) includes an O-ring (6) which compresses and slides during closure.

2 Claims, 1 Drawing Sheet

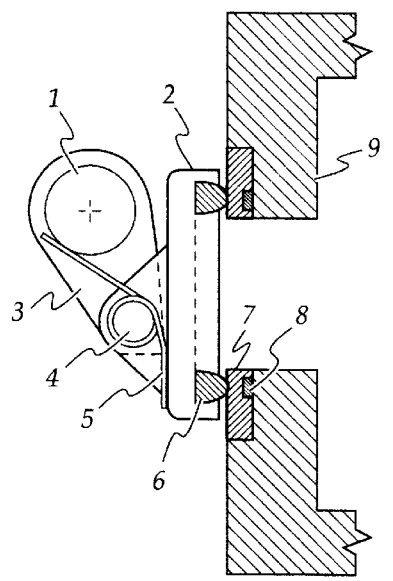
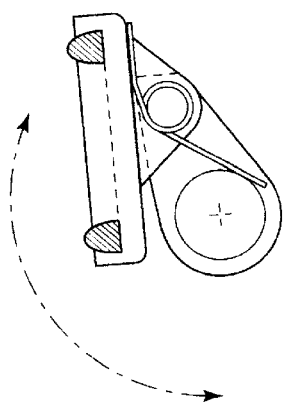
Fig. 1.  Fig. 2.
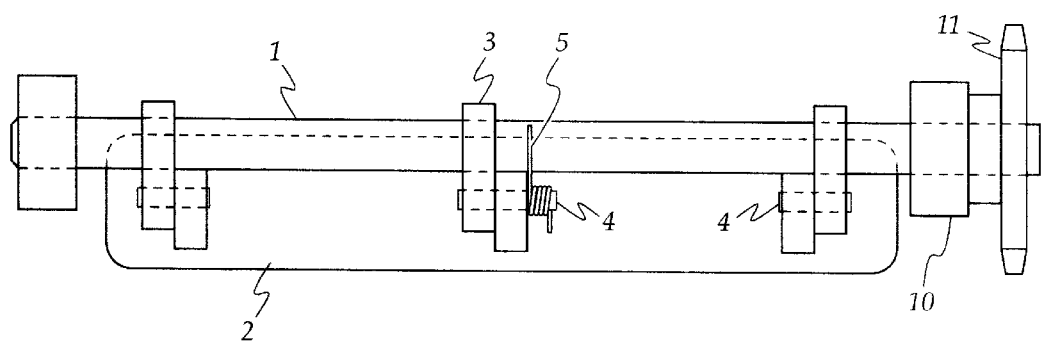
Fig. 3.

SEALING SYSTEM IN WHICH THERE IS RELATIVE SLIDING MOTION BETWEEN A GATE AND A PORT

TECHNICAL FIELD

This invention relates to a sealing system.

This invention has particular but not exclusive, application to sealing systems for chambers adapted to be evacuated. This invention is herein illustrated in the context of a sealing system for an evacuatable airlock which acts as an antechamber for a vapour deposition chamber. However, it will be understood that the invention is not limited to this particular environment.

BACKGROUND ART

Many different sealing systems exist for enabling evacuation of air from vacuum chambers whilst closed, yet enable items to be introduced to or removed from the vacuum chamber whilst open.

Disadvantages with known sealing systems range from high cost and poor reliability to large size where limited space is available.

DISCLOSURE OF INVENTION

This invention in one aspect resides in a method of sealing a port having a sealing face with a gate having a complementary sealing face, the method including:

abutting the gate's sealing face with the port's sealing face and translating the gate's sealing face relative to the port's sealing face in a direction parallel to the port's sealing face.

In the preferred embodiment the abutment of the sealing faces and the translation of the gate's sealing face relative to the port's sealing face occur simultaneously, although they could be sequential movements.

In the preferred embodiment the gate's sealing face approaches the port's sealing face during closing in a direction which includes orthogonal and parallel components relative to the plane of the port's sealing face.

The gate's sealing face or port's sealing face will normally include a resilient member and the resilient member will slide or distort during the relative translation of the sealing faces. In the preferred embodiment, the resilient member is an O-ring which forms part of the sealing face of the gate.

In a second aspect the invention resides in a sealing system including:

gate having a sealing face; and a port having a complementary sealing face, wherein, upon closing, the respective sealing faces abut and the gate's sealing face translates relative to the port's sealing face in a direction parallel to the abutting sealing faces.

Preferably, one of the sealing faces includes a resilient member and preferably the resilient member is an O-ring. The relative translation between the abutting sealing faces causes sliding or distortion of the O-ring which facilitates improved sealing.

Preferably, the gate is pivotably mounted via a mobile pivot axis to a crank member which, in turn, is pivotably mounted about a fixed pivot axis, the mobile pivot axis and fixed pivot axis being substantially parallel.

Preferably, the fixed pivot axis is parallel to and spaced from the plane of the sealing face of the port.

Preferably, during closing, the mobile pivot axis moves in a direction which includes orthogonal and parallel components relative to the plane of the port's sealing face.

Preferably, the crank member is pivoted in a first rotational direction about the fixed pivot axis during closure and the gate member is biased relative to the crank member in the first rotational direction.

In another aspect the invention resides in a gate adapted to be rotated in a first direction to sealably cover an aperture, the gate being pivotably mounted to a crank which is pivotably mounted about a fixed axis.

Preferably, a biasing member is disposed intermediate the crank and gate for biasing the gate in the first direction relative to the crank.

BRIEF DESCRIPTION OF DRAWINGS

In order that this invention may be more easily understood and put into practical effect, reference will now be made to the accompanying drawings which illustrate a preferred embodiment of the invention, wherein:

FIG. 1 is a cross-sectional view of the gate of the sealing system in its closed position.

FIG. 2 is a cross-sectional view of the gate of the sealing system in its open position.

FIG. 3 is a frontal elevation of the gate of the sealing system in its closed position.

BEST MODE

The invention is illustrated in the context of a sealing system for a vapour deposition process which occurs in the presence of a vacuum. The articles being coated may be printed circuit boards and the port is accordingly illustrated as being relatively long and narrow.

With reference to the FIGS, shaft 1 is rotatably mounted in bearing blocks 10 for rotation about a fixed axis in response to input via gear 11. Due to the relative length of the port the shaft is of substantial diameter to resist deflection which would compromise sealing.

Cranks 3 are fixed to shaft 1 and accordingly rotate with shaft 1. Gate plate 2 is rotatably mounted to cranks 3 via pivot pins 4 which define a mobile axis.

Spring 5 biases gate plate 2 in a counter-clockwise direction relative to cranks 3 as shown in FIGS. 1 and 2.

It will be noted that the sealing face of the port is provided by hardened sealing plate 7 and that the sealing face of the gate includes a resilient member in the form of O-ring 6. The hardened sealing plate may be replaced if its surface becomes scratched or worn. The hardened sealing plate 7 is removably mounted to the chamber wall 9 and a further O-ring 8 is provided to seal between the hardened plate 7 and chamber wall 9.

Gate plate 2 has a groove shaped to hold the O-ring 6 captive. Alternatively, an O-ring clamping plate may be provided which simplifies the installation and removal of the O-ring. The O-ring is relatively large in diameter so as to provide a large sealing surface to fully enclose small surface particles and still provide a good vacuum seal.

The open configuration is shown in FIG. 2. To close the sealing system, the entire gate assembly is rotated in the counter-clockwise direction about the fixed axis defined by shaft 1. It will be recalled that the gate plate 2 is biased in the counter clockwise direction relative to the crank 3. This means. that the leading edge of the gate plate 2 (or heel of the gate plate) is initially held clear of the hardened plate 7 during closing. As a result, the trailing edge (or toe of the gate plate) makes first contact with the hardened plate 7. Thereafter, the gate plate 2 rotates clockwise relative to the crank against the spring bias so that the gate plate squarely abuts the hardened plate. More specifically, the O-ring squarely abuts the hardened plate 7. Due to the compressibility of the O-ring the gate continues to close a little further. It should be appreciated that at this time the gate plate 2 continues to approach the port in a direction which includes components which are parallel and orthogonal to the sealing face of the port. The orthogonal component causes compression of the O-ring between the gate and port. The parallel component causes a sliding of the O-ring relative to the hardened plate which has a cleaning or sweeping effect. Specifically, microscopic debris particles are swept ahead of the O-ring allowing a better seal between the O-ring and hardened plate.

The preferred embodiment of the present invention provides a sealing system which is compact, reliable and inexpensive.

It will of course be realised that whilst the above has been given by way of an illustrative example of this invention, all such and other modifications and variations hereto, as would be apparent to persons skilled in the art, are deemed to fall within the broad scope and ambit of this invention as is herein set forth.

The claims defining the invention are as follows:

1. A sealing system including:

a fixed port having a planar sealing face; and a mobile gate having a complementary sealing face bearing a resilient sealing member, the mobile gate being mounted via a mobile pivot axis to a crank member which, in turn, is pivotably mounted about a fixed pivot axis, the mobile pivot axis and fixed pivot axis each being parallel to and spaced from the planar sealing face of the fixed port, the fixed pivot axis being spaced from the planar sealing face of the fixed port by a first distance, measured perpendicularly from the planar sealing face of the fixed port, that is greater than a second distance, measured perpendicularly from the planar sealing face of the fixed port, that the mobile pivot axis is spaced from the planar sealing face of the fixed port when the mobile gate closes the fixed port, such that when the mobile gate engages the fixed port the mobile pivot axis and mobile gate move in a direction which includes a component which is parallel to the planar sealing face of the fixed port such that the resilient sealing member slides on the planar sealing face of the fixed port, and furthermore wherein means for resiliently biasing the mobile gate to pivot about the mobile pivot axis is disposed coaxial with the mobile pivot axis and between the mobile gate and crank member such that the means for resiliently biasing yield during closing of the fixed port with the mobile gate.

2. A sealing system as claimed in claimed 1, wherein the crank member is pivoted in a first rotational direction about the fixed pivot axis as the mobile gate moves from an open position to the position where the mobile gate closes the fixed port and the mobile gate is biased relative to the crank member in the first rotational direction by the means for resiliently biasing.

* * * * *